United States Patent
Miyachi et al.

(10) Patent No.: US 7,723,206 B2
(45) Date of Patent: May 25, 2010

(54) PHOTODIODE

(75) Inventors: Yukiya Miyachi, Ashigarakami-gun (JP); Wojciech P. Giziewicz, Cambridge, MA (US); Jurgen Michel, Cambridge, MA (US); Lionel C. Kimerling, Cambridge, MA (US)

(73) Assignees: FUJIFILM Corporation, Tokyo (JP); Massachusetts Institute of Technology, Cambridge, MA (US)

( * ) Notice: Subject to any disclaimer, the term of this patent is extended or adjusted under 35 U.S.C. 154(b) by 149 days.

(21) Appl. No.: 11/950,700

(22) Filed: Dec. 5, 2007

(65) Prior Publication Data

US 2009/0146178 A1   Jun. 11, 2009

(51) Int. Cl.
*H01L 29/00* (2006.01)
*H01S 3/10* (2006.01)
(52) U.S. Cl. .............. 438/448; 257/457; 257/E31.058; 257/E31.063; 257/E31.115; 257/E25.02; 257/E27.133; 372/20
(58) Field of Classification Search .................. 372/20; 257/448, 457, E31.058, E31.063, E31.115, 257/E25.032, E27.133
See application file for complete search history.

(56) References Cited

U.S. PATENT DOCUMENTS

| | | | | |
|---|---|---|---|---|
| 3,714,491 A * | 1/1973 | McIntyre et al. | ............ | 257/458 |
| 4,514,579 A * | 4/1985 | Hanak | ........................ | 136/249 |
| 5,777,390 A | 7/1998 | Berger et al. | | |
| 6,483,099 B1 * | 11/2002 | Yu et al. | ................... | 250/214.1 |
| 6,635,110 B1 | 10/2003 | Luan et al. | | |
| 7,115,910 B2 * | 10/2006 | Dutta | ........................... | 257/80 |
| 2004/0121507 A1 * | 6/2004 | Bude et al. | .................... | 438/93 |
| 2006/0081768 A1 * | 4/2006 | Dutta | ...................... | 250/214.1 |

OTHER PUBLICATIONS

G.Dehlinger et al., High-Speed Germanium-on-SOI Lateral PIN Photodiodes, IEEE Photonics Technology Letters, Nov. 2004, pp. 2547-2549, vol. 16, No. 11.

* cited by examiner

*Primary Examiner*—Long K Tran
(74) *Attorney, Agent, or Firm*—Sughrue Mion, PLLC (57) ABSTRACT

A photodiode in which increased sensitivity and speed are balanced. The photodiode includes: a semiconductor substrate; a plurality of active regions formed on the substrate by selective epitaxial growth; and a comb electrode provided for each of the plurality of active regions and in communication with each other to electrically connect the active regions together.

13 Claims, 7 Drawing Sheets

PHOTODIODE

BACKGROUND OF THE INVENTION

1. Field of the Invention

The present invention relates to a photodiode.

2. Description of the Related Art

Recently, in order to cope with a dramatic increase in the capacity of networks, epitomized by the widespread use of the Internet, development of high-speed optical transmission systems has been sought. Today, optical fibers having comparatively large apertures that facilitate alignment, such as plastic optical fibers, multimode glass optical fibers, and the like, are drawing increased attention as optical fibers for use not with trunk line systems but "last one mile" transmission systems, including subscriber line systems.

Further, it is demanded that a photodiode (PD), transimpedance amplifier (TIA), semiconductor laser (LD), and the like are monolithically formed on a Si substrate using an ordinary CMOS process that allows mass production at low cost for applications, in particular, to the "last one mile" transmission system.

In the mean time, in order to produce a photodiode capable of responding to light having a wavelength longer than that of visible light with high speed and high sensitivity, a method for manufacturing a photodiode by epitaxially growing a Ge thin film on a Si substrate is proposed as described, for example, in U.S. Pat. No. 6,635,110 (Patent Document 1), and "High-Speed Germanium-on-SOI Lateral PIN Photodiodes", G. Dehlinger et al., IEEE Photon. Technol. Lett., Vol. 16, Issue 11, pp. 2547-2549, 2004, (Non-Patent Document 1). Note that, in principle, GaAs, InGaAs, and InGaAsP may also be used other than Ge, but the use of such materials poses technical difficulties and not realistic. On the other hand, Ge has already started to be used in a manufacturing process of high-speed TIA and the like, as SiGeBi-CMOS process, and would be a preferable material also from the viewpoint of contamination.

Note that if a substrate on which a photodiode is formed has many crystal defects, problems of decreased sensitivity, increased dark current, and the like may result. Generally, it is difficult to obtain quality crystals with less crystal defects such as dislocation and the like by epitaxially growing a different material. However, it is reported in the Patent Document 1 that a quality Ge film may be grown on a Si substrate. More specifically, it is reported that high quality Ge thin film may be grown by performing selective epitaxial growth on a region smaller than or equal to 40 µm×40 µm, preferably smaller than or equal to 20 µm×20 µm. The Non-Patent Document 1 describes that it is possible to create a Ge lateral PIN photodiode of 10 µm×10 µm or 30 µm×30 µm on a SOI substrate using this technique.

Further, MSM (metal-semiconductor-metal) photodiodes, lateral PIN photodiodes, and the like, in which electrodes are arranged laterally, i.e., in the direction parallel to the surface of the substrate in a finger pattern, are known as optical receivers suitable for high-speed and large aperture optical fibers. U.S. Pat. No. 5,777,390 (Patent Document 2) proposes to use transparent electrodes for either one of the types of electrodes in such types of photodiodes in order to alleviate a trade-off between the sensitivity and high-speed response.

Generally, in a photodiode having a transparent electrode, the sensitivity and high-speed response become a trade-off due to (1) a large time constant arising from a high resistance, and (2) generation of low mobility holes even under the positive electrode if the active layer is an intrinsic or lightly doped N type layer, and the travel distance of the holes becomes long. The structure described in the Patent Document 2 tries to reduce the travel distance of the holes by using a transparent electrode (different in material and clearness from that of the other type of electrode) as the electrode for collecting low mobility holes, i.e., negative electrode, while preventing holes from being generated under the positive electrode by using a low resistance nontransparent electrode as the positive electrode, in order to alleviate the trade-off.

However, when manufacturing a photodiode having a large aperture (approximately, a radius of 50 µm, and a cross-sectional area of not less than 7500 µm$^2$) that facilitates optical fiber alignment by simply using the techniques described in Patent Document 1 or Non-Patent Document 1, the problems of decreased sensitivity and increased dark current are recognizable.

Further, in the structure described in Patent Document 2, the use of long transparent electrodes results in high resistance, and, in effect, there still exists the problem of the trade-off between increased sensitivity and speed.

SUMMARY OF THE INVENTION

The present invention has been developed in view of the circumstances described above, and it is an object of the present invention to provide a photodiode, which may be manufactured through an ordinary CMOS process suitable for mass production or the like, and has high sensitivity and high-speed response, as well as easily formed to have a large aperture.

The photodiode according to the present invention is a photodiode including:

a semiconductor substrate;

a plurality of active regions formed on the substrate by selective epitaxial growth; and a comb electrode provided for each of the plurality of active regions and in communication with each other to electrically connect the active regions together.

Preferably, in the photodiode of the present invention having the basic structure described above, a negative electrode and a positive electrode of the comb electrode provided for each of the plurality of active regions are respectively in communication with each other.

Further, it is preferable that at least one of the plurality of active regions is formed in a rectangular shape.

Still further, in the photodiode of the present invention, it is preferable that each of the plurality of active regions is formed in a rectangular shape, and the active regions are arranged side by side in such a manner as to occupy a substantially maximum area of the substrate within a circular region to which a core end face of an optical fiber that outputs detection target light is aligned.

Further, in the photodiode of the present invention, it is preferable that an electrode for collecting electric currents from the comb electrode is formed on a portion of the substrate other than the active regions. In this case, it is preferable that the electrode for collecting electric currents from the comb electrode is common to each comb electrode provided for each of the plurality of active regions.

Still further, in the photodiode of the present invention, it is preferable that the comb electrode is a transparent electrode, and the electrode for collecting electric currents from the comb electrode is a nontransparent electrode having a smaller resistance value than that of the transparent electrode. In this case, it is preferable that the transparent electrode is made of at least one of the materials selected from the group consisting of poly-Si, ITO (Indium Tin Oxide), IZO (Indium Zinc Oxide), and CTO (Cadmium Tin Oxide), and the nontransparent electrode is made of at least one of the materials selected from the group consisting of Al, AlSi, Ti, TiN, and Cu.

Further, in the photodiode of the present invention, it is preferable that the semiconductor substrate is a Si, SOI, or SiGe substrate, and each of the active regions is made of an $Si_xGe_{1-x}(0 \leq x \leq 0.2)$ film formed by epitaxial growth.

Still further, in the photodiode of the present invention, it is preferable that an electrical circuit, such as a TIA or the like following the comb electrode, is formed on the substrate.

Further, in the photodiode of the present invention, it is preferable that another active region is formed by selective epitaxial growth other than the active regions, each provided with the comb electrode, and the electrical circuit, such as TIA or the like following the comb electrodes, is formed on the another active region.

Still further, it is preferable that the electrical circuit described above is a circuit for amplifying electric currents collected by the comb electrode.

Further, in the photodiode of the present invention, it is preferable that each of the plurality of active regions is formed in a square shape of less than 40 μm on a side, or in a rectangular shape with a short side of less than 40 μm.

Still further, in the photodiode of the present invention, it is preferable that the distance between each of the plurality of active regions is greater than or equal to 1 μm.

The photodiode of the present invention includes: a semiconductor substrate; a plurality of active regions formed on the substrate by selective epitaxial growth; and a comb electrode provided for each of the plurality of active regions and in communication with each other to electrically connect the active regions together. This structure may provide a large light receiving area, which is the sum of each of the active regions. Thus, the photodiode of the present invention may have increased sensitivity.

Further, the use of the active regions formed by selective epitaxial growth may reduce crystal defects which lead to decreased sensitivity and increased dark currents. In this respect, increased aperture, as well as increased sensitivity, may be realized.

The comb electrode is provided for each of a plurality of active regions, so that the length of each comb electrode may be reduced even the total light receiving area is increased. In addition, the electrode connected to the comb electrode for collecting photocurrents maybe formed at a place adjacent to the comb electrode. In this way, the length of each electrode may be reduced, so that a high speed operation is also realized without compromising the effects of increased sensitivity obtained in the manner as described above.

Further, the photodiode of the present invention has the aforementioned structure, so that it may be produced using an ordinary CMOS process suitable for mass production.

More specifically, the photodiode of the present invention having the aforementioned comb electrode may be structured as a MSM (Metal-Semiconductor-Metal) photodiode, or a lateral PIN photodiode.

Further, in the photodiode of the present invention, if a negative electrode and a positive electrode of the comb electrode provided for each of the plurality of active regions are respectively in communication with each other, the number of negative/positive electrode pairs becomes only one, so that a single optical signal is generated through the pair of negative and positive electrodes. That is, in this case, each of the plurality of active regions functions for generating the single optical signal, which may ensure a particularly large light receiving area, so that a significant increase in sensitivity is realized.

Still further, if at least one of the plurality of active regions is formed in a rectangular shape, particularly high quality crystals may be obtained. That is, dislocations are accumulated in the side walls of $SiO_2$ or SiON used for selective epitaxial growth by annealing. In principle, when an ordinary Si(100) substrate is used, there is not anisotropy between the [110] direction and [1-10] direction of Ge crystals, so that high quality crystals are thought to be obtained through selective growth by making a side of the rectangle substantially small.

Further, in the photodiode of the present invention, if each of the plurality of active regions is formed in a rectangular shape, and the active regions are arranged side by side in such a manner as to occupy a substantially maximum area of the substrate within a circular region to which a core end face of an optical fiber that outputs detection target light is aligned, the photodiode may receive the light outputted from the core end face of the optical fiber at maximum efficiency when the optical fiber is coupled to the photodiode to detect the light.

Still further, in the photodiode of the present invention, if the electrode for collecting electric currents from the comb electrode is formed on a portion of the substrate other than the active regions, a more advantageous effect for increasing sensitivity may be obtained since the effective light receiving area is not decreased by the electrodes.

In this case, if the electrode for collecting electric currents from the comb electrode is common to each comb electrode provided for each of the plurality of active regions, only a small space of the substrate is required for the electrode, so that a larger light receiving area may be obtained and the sensitivity may be further increased.

Further, in the photodiode of the present invention, if the comb electrode is a transparent electrode, and the electrode for collecting electric currents from the comb electrode is a nontransparent electrode having a smaller resistance value than that of the transparent electrode, the transparent electrode having a relatively high resistance value but is short, and does not limit the light receiving area is disposed on the active region, while the major portion of the nontransparent electrode that blocks light but has a low resistance value is disposed outside of the active region. Consequently, according to the structure described above, the effect of increased sensitivity obtained by ensuring a large light receiving area, and the effect of increased speed by reducing the resistance of each of the electrodes are balanced. That is, in this case, the trade-off between increased sensitivity and speed is alleviated.

Still further, in the photodiode of the present invention, if the semiconductor substrate is a Si, SOI, or SiGe substrate, and each of the active regions is made of an $Si_xGe_{1-x}(0 \leq x \leq 0.2)$ film formed by epitaxial growth, a high quality $Si_xGe_{1-x}$ thin film may be grown on the $SiO_2$ or SiON substrate as described in Patent Document 1, which provides a particularly significant effect of increased speed and sensitivity. Note that Ge or SiGe has high mobility and suitable for high speed operations, but it is difficult to obtain high quality crystals by hetero-growth from a Si substrate. In contrast, in the case of selective epitaxial growth, high quality crystals may be obtained.

Further, in the photodiode of the present invention, if another active region is formed by selective epitaxial growth other than the active regions provided with the comb electrodes, and the electrical circuit following the comb electrodes is formed on the another active region, the operation speed of the circuit may also be increased.

DESCRIPTION OF THE PREFERRED EMBODIMENTS

Hereinafter, exemplary embodiments of the present embodiment will be described in detail with reference to the accompanying drawings.

First Embodiment

Figure 1:
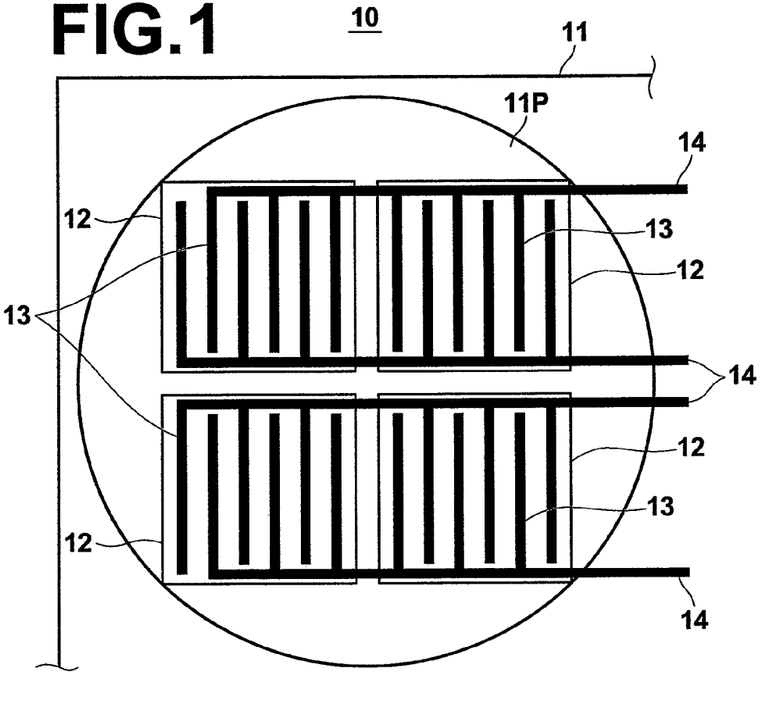
FIG. 1 is a schematic plan view illustrating the photodiode according to a first embodiment of the present invention.

FIG. 1 is a schematic plan view illustrating the photodiode 10 according to a first embodiment of the present invention. The photodiode 10 is a lateral photodiode having a comb electrode, such as aforementioned MSM (metal-semiconductor-metal) photodiode, lateral PIN photodiode, or the like. The photodiode 10 includes: one circular photodiode region 11P provided on a semiconductor substrate 11; a plurality of (for example, four) active regions 12 formed on the photodiode region 11P by selective epitaxial growth; a comb electrode 13 provided for each of the active regions 12 and in communication with each other to electrically connect the active regions 12 together; and electrodes 14 connected to the comb electrodes 13.

Figure 2:
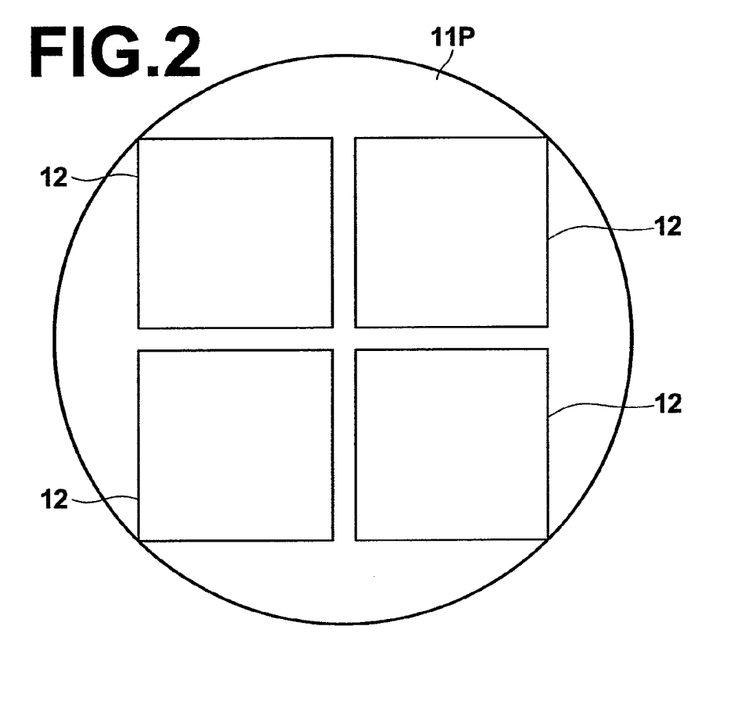
FIG. 2 a schematic plan view illustrating a portion of the photodiode shown in FIG. 1.

As for the semiconductor substrate 11, for example, a Si substrate is used, and an insulation layer of $SiO_2$ or SiON is deposited thereon by thermal oxidation, CVD, or the like. Each of the active regions 12 is made of a Ge film formed on the substrate 11 by selective epitaxial growth. FIG. 2 illustrates the arrangement of the active regions 12 in the photodiode region 11P. As illustrated in FIG. 2, each active region 12 is formed in a substantially square shape with a maximum possible size within the circular photodiode region 11P.

Here, the photodiode region 11P will be described. The photodiode 10 of the present embodiment is used, coupled with an optical fiber (not shown) that outputs detection target light, as an example case. The photodiode region 11P does not differ, in composition, from the outer region thereof, and is set as a target region for determining the position of the optical fiber when coupled. That is, the optical fiber is coupled to the photodiode 10 such that a circular core end face of the optical fiber is aligned with the photodiode region 11P. The same applies to photodiode regions 11P and 61P to be described in other embodiments of the present invention.

In the mean time, the comb electrode 13 includes a plurality of comb-tooth like sections for mainly collecting electrons and holes generated in the active region 12, and connected to the electrode 14 for collecting photocurrents and sending them to an external circuit, such as TIA or the like. Specifically, the comb electrode 13 and the electrode 14 may be formed of Al, AlSi, Ti, TiN, Cu, Ag, Au, ITO, IZO, CTO, Poly Si, Poly Ge, Silicide compounds (Ti, Ta, Co, Pt), and the like.

In the structure describe above, specific example sizes are as follows. The total area of the four active regions 12 is 1500 to 130000 $\mu m^2$, which is determined on the assumption that an optical fiber with a diameter of 50 $\mu m$ or 400 $\mu m$ is coupled. Preferably, the active region 12 has such a size so that the distance from the center of the selective epitaxial growth to the nearest side wall (to be described later) becomes 20 $\mu m$ or less, more preferably 10 $\mu m$ or less. The width of the side wall, i.e., the distance between the active regions 12, is 1 to 10 $\mu m$.

In the mean time, the width of the comb electrode 13 is approximately 0.5 to 1.5 $\mu m$, the distance between the electrodes is approximately 0.5 to 5 $\mu m$, and the width of the electrode 14 for collecting photocurrents is approximately 0.5 to 4 $\mu m$.

Hereinafter, a method for manufacturing a photodiode structured in the manner as described above will be described with reference to FIG. 3. Here, the description will be made of a case in which a Si substrate is used as the semiconductor substrate 11, and the active regions are formed of a thin Ge film.

1) Forming a $SiO_2$ layer on the surface of the Si substrate in order to form a mask of selective epitaxial growth. Alternatively, a $SiO_2$ or SiON layer may be formed on the surface of the Si substrate by deposition.

2) Etching the $SiO_2$ or SiON layer to peel the Si surface of the window regions where selective epitaxial growth is performed (patterning).

Figure 3A:
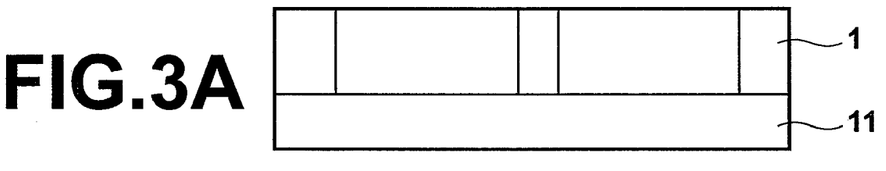
FIGS. 3A to 3E are drawings illustrating a process for manufacturing the photodiode shown in FIG. 1.

The state of the substrate 11 which has completed the process steps so far is illustrated in FIG. 3A. In the drawing, the reference numeral 1 indicates the $SiO_2$ or SiON layer which will serve as the mask. Then, the method continues to 3) Performing cleaning as appropriate.

4) Performing selective epitaxial growth at a low temperature (360° C.) using an LP (preferably, UHV) CVD system to grow a Ge thin film (film thickness of 50 to 100 nm).

5) Performing selective epitaxial growth at a high temperature (700 to 750° C.) using an LP (preferably, UHV) CVD system to further grow a Ge thin film (film thickness of 0.4 to 1 $\mu m$).

6) Performing annealing for thirty minutes at 850° C. using a furnace. Alternatively, the annealing may be performed for three minutes at 850° C. using a rapid thermal annealer (RTP). Otherwise, cyclic annealing may be performed between 700 to 900° C. for about ten times.

Figure 3B:
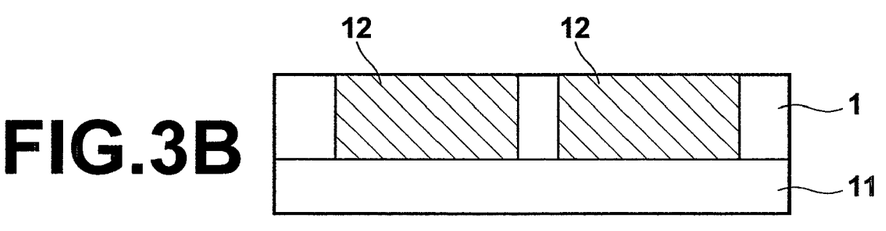

The state of the substrate 11 which has completed the process steps so far is illustrated in FIG. 3B. In the drawing, the reference numeral 12 indicates the Ge thin film, and the reference numeral 1 indicates the $SiO_2$ or SiON remaining as side walls. Then, the method continues to 7) Depositing a $SiO_2$ or SiON layer.

Steps that follow differ depending on which structure is to be provided among an ordinary MSM structure, an ordinary lateral PIN structure, and the lateral PIN structure described in Patent Document 1, therefore, steps for each of the three cases will be described successively.

(Ordinary MSM Structure)

8) Etching a comb electrode pattern in the SiO$_2$ or SiON layer.

9) Forming a metal layer, to be formed into electrodes, by sputtering or the like.

10) Patterning the comb electrodes by etching the SiO$_2$ or SiON layer.

11) Forming a SiO$_2$ or SiON passivation layer.

Figure 3C:
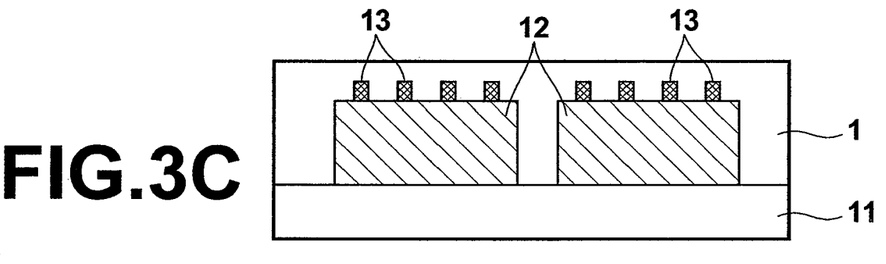

The state of the substrate 11 which has completed the process steps so far is illustrated in FIG. 3C. In the drawing, the reference numeral 1 indicates the SiO$_2$ or SiON, reference numeral 12 indicates the active region, and the reference numeral 13 indicates the comb electrodes.

(Ordinary Lateral PIN Structure)

8) Etching an N-type contact region pattern in the SiO$_2$ or SiON layer.

9) Forming N-type contact regions by ion implantation (P+ or As+).

10) Etching a P-type contact region pattern in the SiO$_2$ or SiON layer.

11) Forming P-type contact regions by ion implantation (B−)

12) Forming a SiO$_2$ or SiON passivation layer.

13) Annealing the portion of ion implantation (650 to 700° C.).

14) Forming a SiO$_2$ or SiON passivation layer.

15) Etching a comb electrode pattern in the passivation layer.

16) Forming a metal layer, to be formed into electrodes, by sputtering or the like.

17) Patterning the comb electrodes by etching the SiO$_2$ or SiON layer.

18) Forming a SiO$_2$ or SiON passivation layer.

Figure 3D:
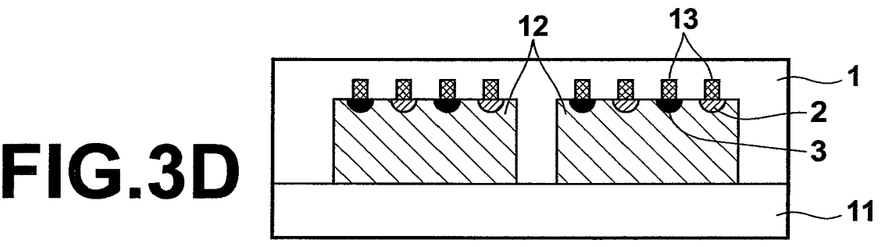

The state of the substrate 11 which has completed the process steps so far is illustrated in FIG. 3D. In the drawing, the reference numeral 1 indicates SiO$_2$ or SiON, reference numeral 2 indicates the N-type contact region, reference numeral 3 indicates the P-type contact region, reference numeral 12 indicates the active region, and reference numeral 13 indicates the comb electrode.

(Lateral PIN Structure of Patent Document 1)

8) Etching a contact region pattern on the SiO$_2$ or SiON layer.

9) Depositing Poly Si.

10) Patterning N-type contact regions.

11) Forming N-type regions by ion implantation (P+ or As+)

12) Patterning P-type contact regions.

13) Forming P-type regions by ion implantation (B−).

14) Forming a SiO$_2$ or SiON passivation layer.

15) Annealing the portion of ion implantation (650 to 700° C.).

16) Forming a SiO$_2$ or SiON passivation layer.

17) Etching a comb electrode pattern in the passivation layer.

18) Forming a metal layer, to be formed into electrodes, by sputtering or the like.

19) Patterning the comb electrode by etching the SiO$_2$ or SiON layer.

20) Forming a SiO$_2$ or SiON passivation layer.

Figure 3E:
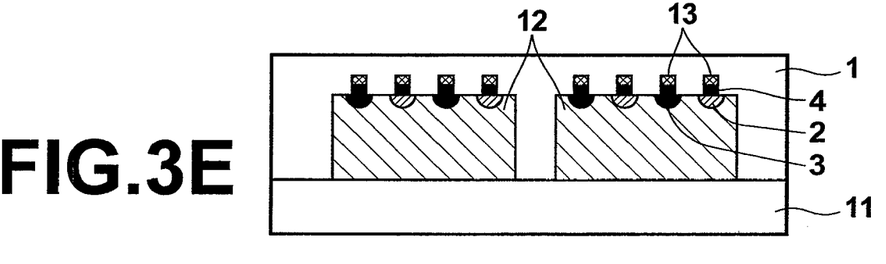

The state of the substrate 11 which has completed the process steps so far is illustrated in FIG. 3E. In the drawing, the reference numeral 1 indicates the SiO$_2$ or SiON, reference numeral 2 indicates the N-type contact region, reference numeral 3 indicates the P-type contact region, reference numeral 4 indicates poly-Si, reference numeral 12 indicates the active region, and reference numeral 13 indicates the comb electrode.

The photodiode 10 of the present embodiment structured in the manner as described above has a large light receiving area, which is the sum of the four active regions 12, so that it has increased sensitivity. Further, the use of the active regions 12 formed by selective epitaxial growth may reduce crystal defects which lead to decreased sensitivity and increased dark currents. In this respect, increased aperture, as well as increased sensitivity, may be realized.

The comb electrode 13 is provided for each of a plurality of active regions 12, so that the length of each comb electrode 13 may be reduced even the total light receiving area is increased. In addition, the electrode 14 connected to the comb electrode 13 for collecting photocurrents may be formed at a place adjacent to the comb electrode 13. In this way, the length of each of electrodes may be reduced, so that a high speed operation is also realized without compromising the effects of increased sensitivity obtained in the manner as described above.

Further, as described above, the photodiode 10 may be manufactured using an ordinary CMOS process suitable for mass production.

Still further, in the photodiode 10 of the present embodiment, two of the four electrodes 14 shown in FIG. 1 located in the center are connected to a common signal line as the positive electrode, and the other two located outer sides are grounded as the negative electrode. In this way, when the negative electrodes and positive electrodes are respectively in communication with each other, the number of negative/positive electrode pairs becomes only one, so that a single optical signal is generated through the pair of negative and positive electrodes. That is, in this case, each of the plurality of active regions 12 functions for generating the single optical signal, which may ensure a particularly large light receiving area, so that significant increase in the sensitivity may be realized.

Preferably, in the photodiode 10 of the present embodiment, the comb electrode 13 is a transparent electrode, and the electrode 14 is a low resistance nontransparent electrode. If that is the case, the transparent electrode (comb electrode) 13 having a relatively high resistance value but is short, and does not limit the light receiving area is disposed on the active region 12, while the major portion of the nontransparent electrode 14 that blocks light but has a low resistance value is disposed outside of the active region 12. Consequently, according to the structure described above, the effect of increased sensitivity obtained by ensuring a large light receiving area, and the effect of increased speed by reducing the resistance of each of the electrodes are balanced. That is, in this case, the trade-off between increased sensitivity and speed is alleviated.

Further, in the photodiode 10 of the present embodiment, each of the plurality of active regions is formed in a rectangular shape, and arranged side by side so as to occupy a substantially maximum area of the substrate 11 within the circular photodiode region 11P. This allows the photodiode 10 to receive light outputted from the core of the optical fiber described above at maximum efficiency by fully utilizing the area of the photodiode region 11P.

Still further, the photodiode 10 of the present embodiment includes: the semiconductor substrate 11, which is a SiO$_2$ or SiON substrate (SiGe substrate may also be used); and the active region 12 formed of a Ge thin film provided by epitaxial growth, so that a high quality Ge thin film may be grown on a SiO$_2$ or SiON substrate as described in Patent Document 1, which provides a particularly significant effect of increased speed and sensitivity.

Second Embodiment

Figure 4A:
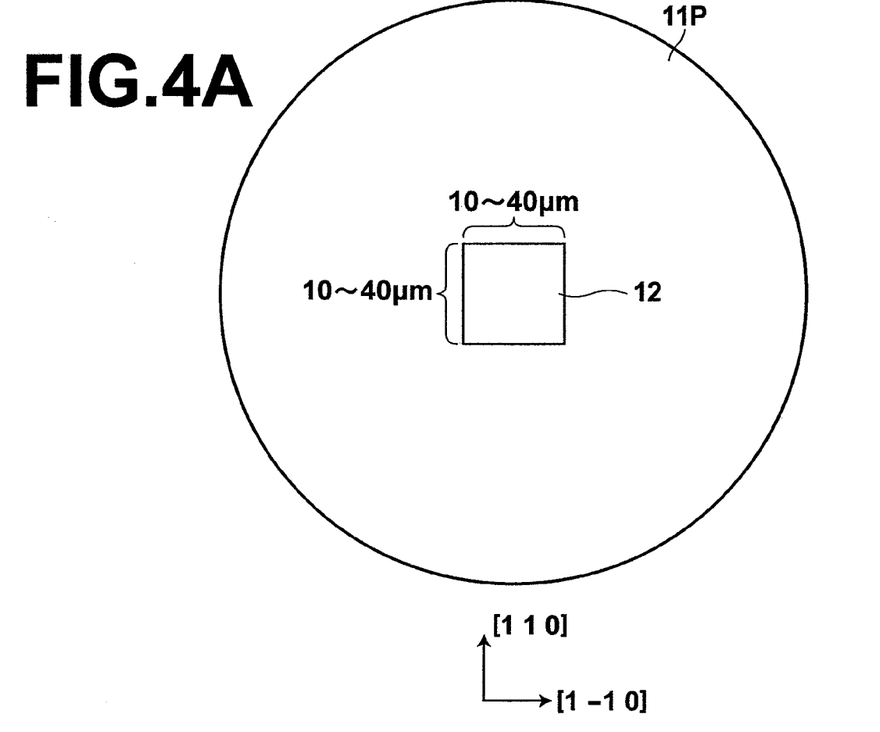
FIGS. 4A and 4B are schematic plan views illustrating example shapes of an active region applied to the photodiode of the present invention.
Figure 4B:
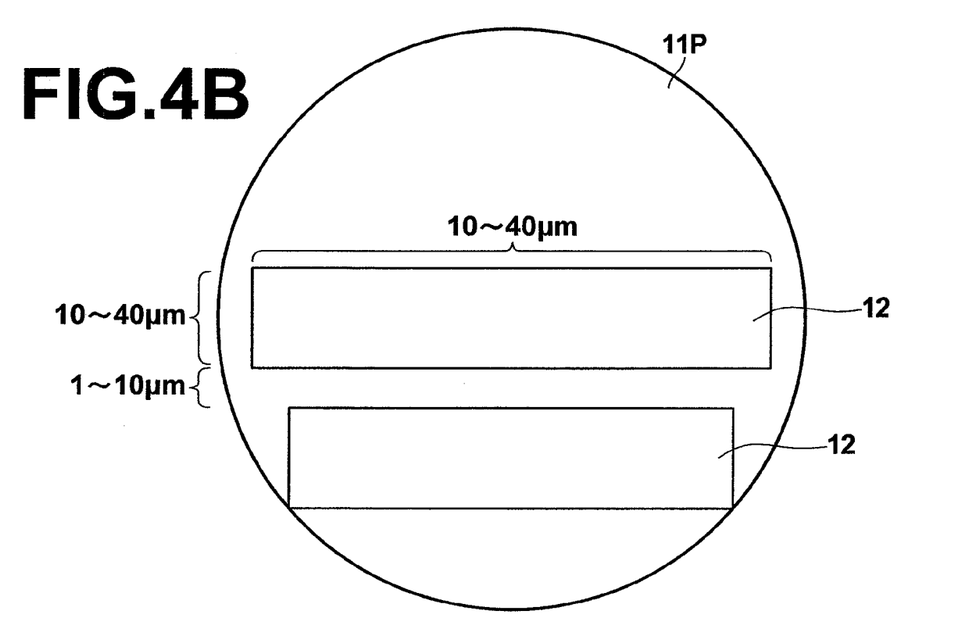

Firstly, advantageous effects of rectangular selective epitaxial growth will be described with reference to FIGS. 4A and 4B. FIGS. 4A and 4B illustrate example cases where a square active region 12 and a rectangular active region 12 are formed on the photodiode regions 11P respectively.

It is expected that the active region may be increased, and hence the sensitivity, by reducing the area of the SiO$_2$ or SiON side wall sections. That is, the dislocations are accumulated in the side wall sections by annealing. In principle, when an ordinary Si(100) substrate is used, there is not anisotropy between the [110] direction and [1-10] direction of Ge crystals, so that high quality crystals are thought to be obtained through selective growth by making a side of the rectangle substantially small. Note that, however, in the case of rectangle, it is necessary to increase the annealing time or the number of cyclic annealing processes due to decreased efficiency of dislocations to reach the side wall sections.

Figure 5:
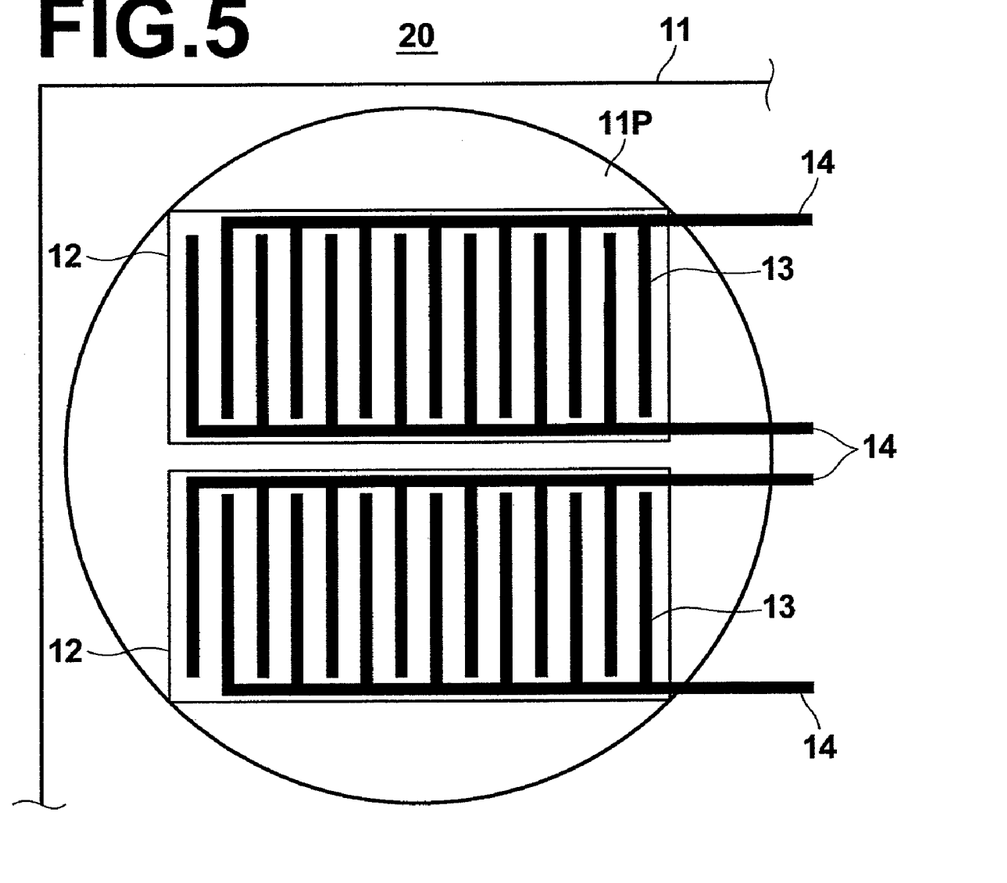
FIG. 5 is a schematic plan view illustrating the photodiode according to a second embodiment of the present invention.

FIG. 5 is a schematic plan view illustrating the photodiode 20 according to a second embodiment of the present invention, which is obtained based on the viewpoint described above. In FIG. 5, elements identical to those shown in FIG. 1 are given the same reference numerals and will not be elaborated upon further here unless otherwise specifically required (the same applies hereinafter). The photodiode 20 differs from the photodiode 10 of the first embodiment shown in FIG. 1, in that it has a rectangular active region 12 obtained by integrating two active regions 12 horizontally arranged in FIG. 1. In the photodiode 20 structured in the manner as describe above, the area of the active region is increased by providing two rectangular active regions 12 and sensitivity may be increased as described above.

Third Embodiment

Figure 6:
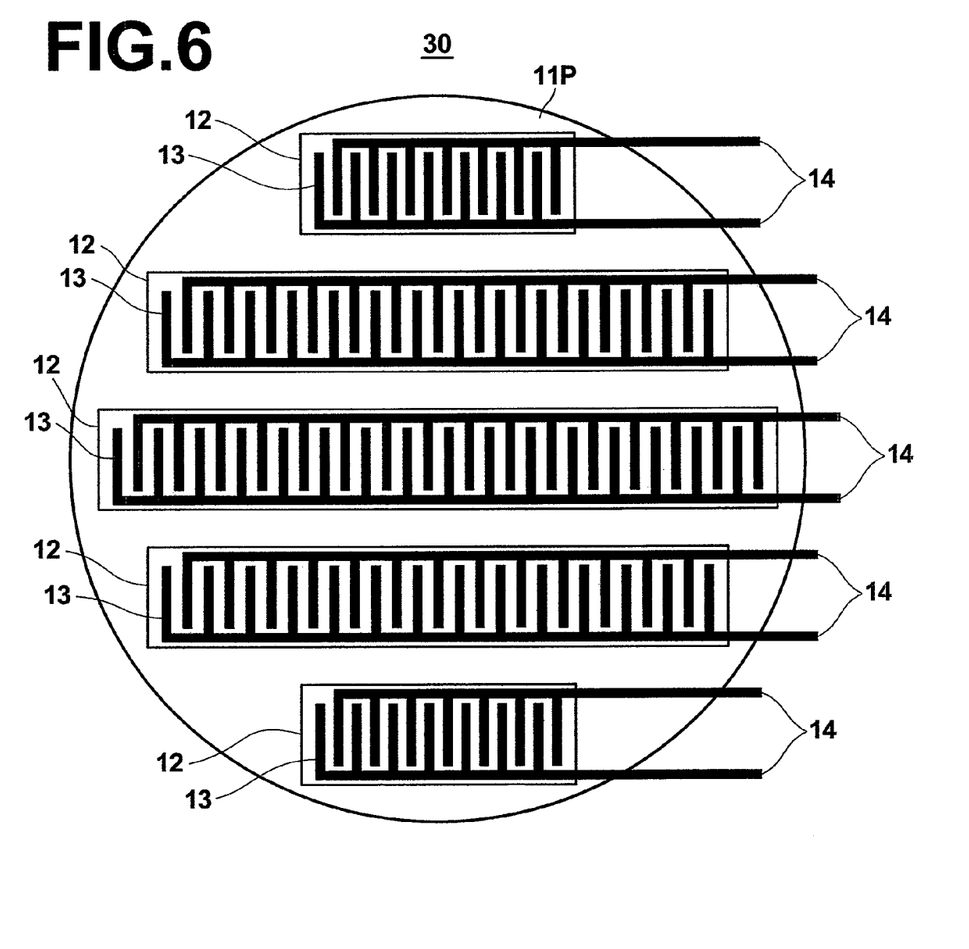
FIG. 6 is a schematic plan view illustrating the photodiode according to a third embodiment of the present invention.

Next, another embodiment of the present invention will be described with reference to FIG. 6. FIG. 6 is a schematic plan view illustrating the photodiode 30 according to a third embodiment of the present invention. In the photodiode 30, a plurality of active regions (five in this case) 12 is formed in rectangle as in the second embodiment. However, unlike the second embodiment, the plurality of active regions does not have a common size. Instead, they have different sizes with the central active region having a largest size in order to obtain a maximum possible light receiving area within the circular photodiode region 11P. The photodiode 30 structured in the manner as described above may also provide the aforementioned advantageous effects by forming the plurality of active regions 12 in rectangle.

Fourth Embodiment

Figure 7:
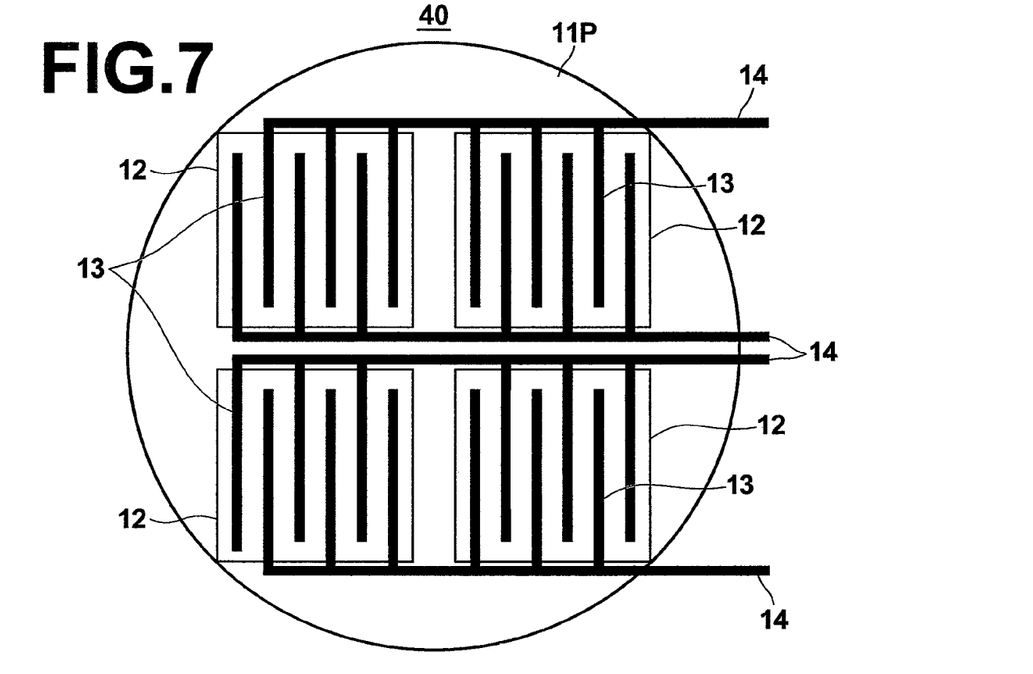
FIG. 7 is a schematic plan view illustrating the photodiode according to a fourth embodiment of the present invention.

Next, still another embodiment of the present invention will be described with reference to FIG. 7. FIG. 7 is a schematic plan view illustrating the photodiode 40 according to a fourth embodiment of the present invention. The photodiode 40 differs from the photodiode 10 of the first embodiment shown in FIG. 1, in that each of the electrodes 14 thereof for collecting electric currents from comb electrodes is formed to extend outside of the active regions 12.

In this way, provision of the electrodes 14 outside of the active regions 12 within the photodiode region 11P is more advantageous for increasing sensitivity since the effective light receiving area is not decreased by the electrodes 14.

Fifth Embodiment

Figure 8:
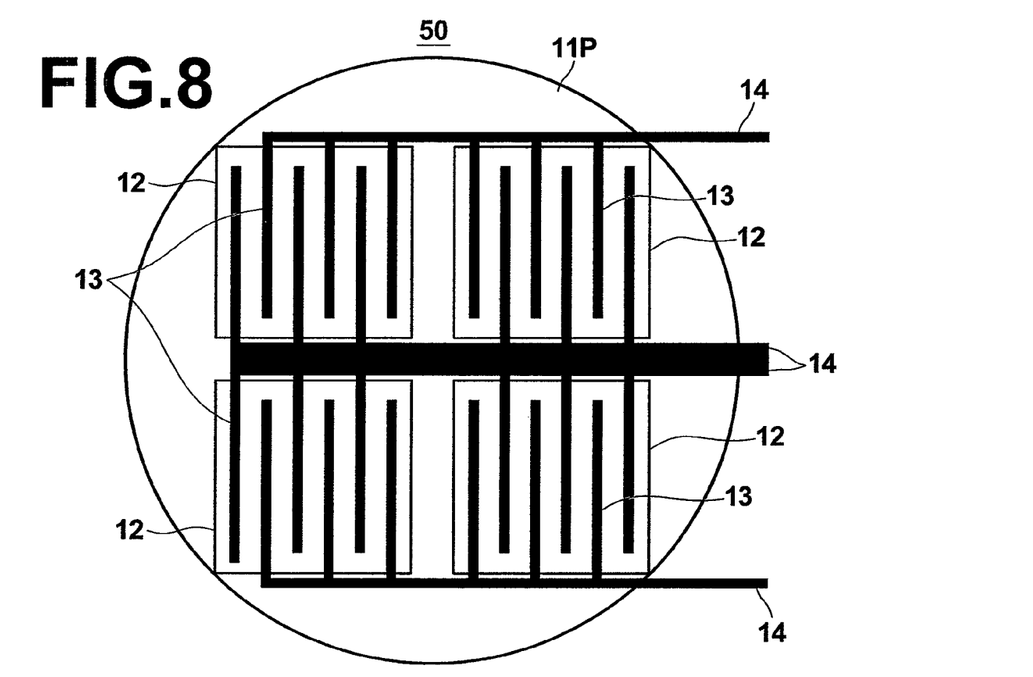
FIG. 8 is a schematic plan view illustrating the photodiode according to a fifth embodiment of the present invention.

Next, a further embodiment of the present invention will be described with reference to FIG. 8. FIG. 8 is a schematic plan view illustrating the photodiode 50 according to a fifth embodiment of the present invention. In the photodiode 50, each of the electrodes 14 for collecting electric currents from the comb electrodes is formed to extend outside of the active regions 12 as in the photodiode 40 shown in FIG. 7. Further, in the present embodiment, the lower side electrode 14 for the upper two active regions 12 is shared by the upper side electrode 14 for the lower two active regions 12 in FIG. 8.

Thus, the structure may provide advantageous effects similar to those of the fourth embodiment. In addition, it allows more space of the photodiode region 11P to be used for the active regions 12 by the electrode sharing described above, so that a larger light receiving area may be obtained and the sensitivity may be further increased. Further, simplification of the electrode structure will also lead to cost reduction.

Sixth Embodiment

Figure 9:
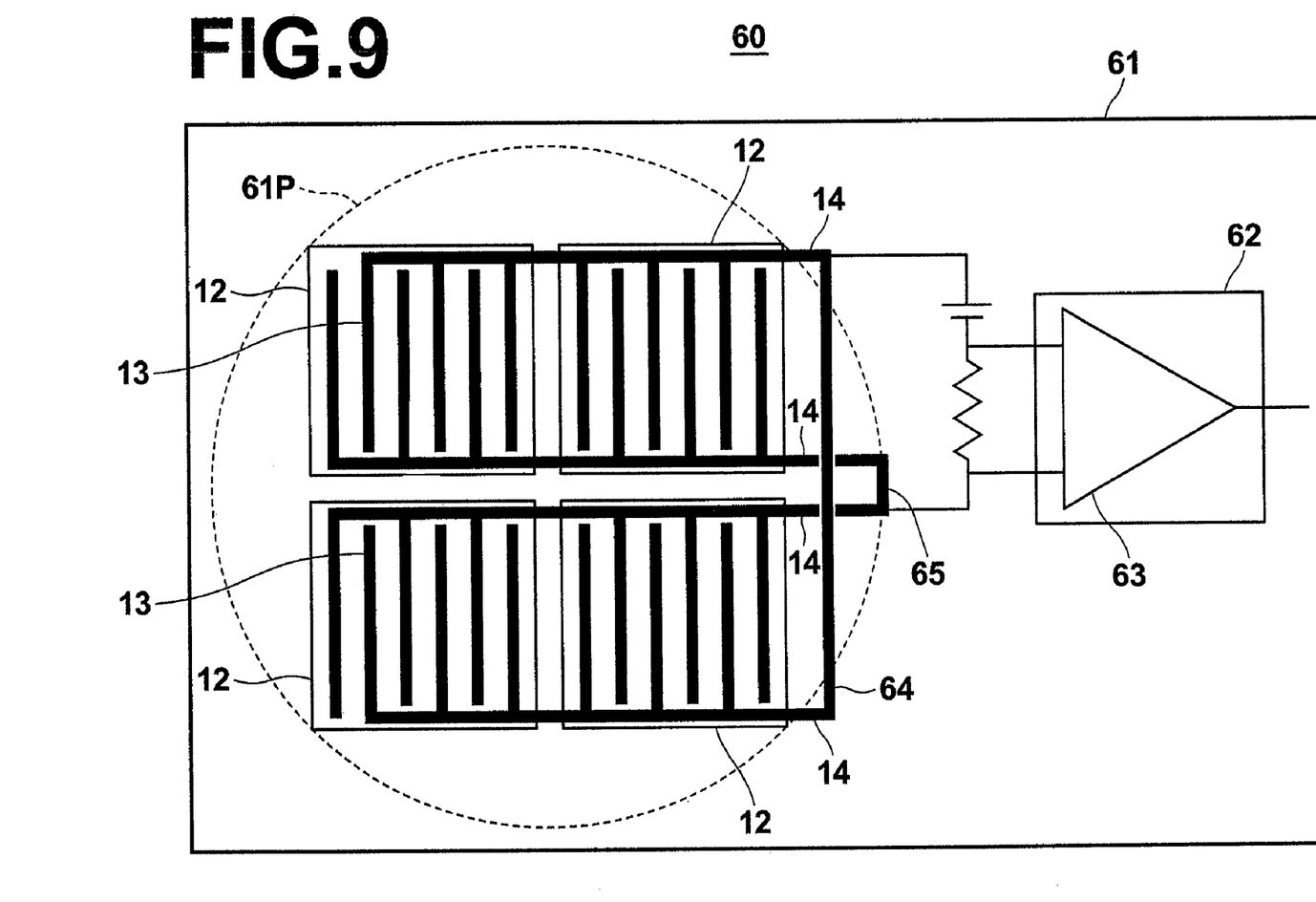
FIG. 9 is a schematic plan view illustrating the photodiode according to a sixth embodiment of the present invention.

Next, a still further embodiment of the present invention will be described with reference to FIG. 9. FIG. 9 is a schematic plan view illustrating the photodiode 60 according to a sixth embodiment of the present invention. The photodiode 60 includes a rectangular semiconductor substrate 61, and a basically identical structure to that of the photodiode 10 shown in FIG. 1 is provided on a portion thereof. The region indicated by a dotted line circle in the drawing is a photodiode region 61P serving as a light receiving area corresponding, for example, to an optical fiber.

In addition to four active regions 12, another active region 62 is formed on the semiconductor substrate 61. The active region 62 is formed by a process identical to that for forming the light receiving active regions 12, and includes a TIA 63 which is a subsequent electrical circuit of the comb electrodes 13. The outer electrode 14 for the upper two active regions 12 and the outer electrode 14 for the lower two active regions 12 in the drawing are connected to the TIA 63 through an electrode 64. The outside electrode 14 for the upper two active regions 12 and the outside electrode 14 for the lower two active regions 12 in the drawing are connected to the TIA 63 through an electrode 64. The inside electrode 14 for the upper two active regions 12 and the inside electrode 14 for the lower two active regions 12 in the drawing are connected to the TIA 63 through an electrode 65.

In this structure, photocurrents collected by the electrodes 14 from the comb electrode 13 of each of the active regions 12 are inputted to the TIA 63 and amplified. The TIA 63 is formed on the active region 62 which is formed by selective epitaxial growth with a relatively good crystal quality using a material having high carrier mobility in comparison with Si, so that the TIA 63 may operate rapidly.

Note that a circuit which is not required of a high-speed operation, unlike the TIA 63, may be formed directly on the semiconductor substrate 11 without providing the active region 62.

Although not explained in each of the embodiments, the detailed structure employed in the first embodiment may be employed, as appropriate, in the second to sixth embodiments of the present invention.

What is claimed is:

1. A photodiode comprising:
   a semiconductor substrate;
   a plurality of active regions formed on the substrate by selective epitaxial growth; and
   a comb electrode provided for each of the plurality of active regions and in communication with each other to electrically connect the active regions together,
   wherein negative electrodes of the comb electrode provided for each of the plurality of active regions are physically connected with each other,
   wherein positive electrodes of the comb electrode provided for each of the plurality of active regions are physically connected with each other, and
   wherein light is converted by the photodiode to an electrical signal for data communication.

2. The photodiode according to claim 1, wherein at least one of the plurality of active regions is formed in a rectangular shape.

3. The photodiode according to claim 1,
   wherein:
   each of the plurality of active regions is formed in a rectangular shape; and
   the active regions are arranged side by side in such a manner as to occupy a substantially maximum area of the substrate within a circular region to which a core end face of an optical fiber that outputs detection target light is aligned.

4. The photodiode according to claim 1,
   wherein:
   the semiconductor substrate is a Si, SOI, or SiGe substrate; and
   each of the active regions is made of an $Si_xGe1-x$ ($0 \leq x \leq 0.2$) film formed by epitaxial growth.

5. The photodiode according to claim 1, wherein each of the plurality of active regions is formed in a square shape of less than 40 μm on a side, or in a rectangular shape with a short side of less than 40 μm.

6. The photodiode according to claim 1, wherein the distance between each of the plurality of active regions is greater than or equal to 1 μm.

7. The photodiode according to claim 1, wherein the negative electrodes of the comb electrode comprise a first electrode for collecting electric currents from the comb electrode,
   wherein the positive electrodes of the comb electrode comprise a second electrode for collecting electric currents from the comb electrode, and
   wherein the first and second electrodes are formed on a portion of the substrate other than the active regions.

8. The photodiode according to claim 7, wherein the first electrode for collecting electric currents from the comb electrode is common to each of the negative electrodes of the comb electrode provided for each of the plurality of active regions, and
   wherein the second electrode for collecting electric currents from the comb electrode is common to each of the positive electrodes of the comb electrode provided for each of the plurality of active regions.

9. The photodiode according to claim 7,
   wherein:
   the positive and negative electrodes of the comb electrode within the plurality of active regions are transparent electrodes; and
   the first and second electrodes for collecting electric currents from the positive and negative electrodes of the comb electrode are nontransparent electrodes having a smaller resistance value than that of the transparent electrode.

10. The photodiode according to claim 9,
    wherein:
    the transparent electrodes are made of at least one of the materials selected from the group consisting of poly-Si, ITO (Indium Tin Oxide), IZO (Indium Zinc Oxide), and CTO (Cadmium Tin Oxide); and
    the nontransparent electrodes are made of at least one of the materials selected from the group consisting of Al, AlSi, Ti, TiN, and Cu.

11. The photodiode according to claim 1, wherein an electrical circuit following the comb electrode is formed on the substrate.

12. The photodiode according to claim 11, wherein another active region is formed by selective epitaxial growth other than the active regions, each provided with the comb electrode, and the electrical circuit following the comb electrode is formed on the another active region.

13. The photodiode according to claim 11, wherein the electrical circuit is a circuit for amplifying electric currents collected by the comb electrode.

* * * * *